United States Patent
Verma et al.

(10) Patent No.: US 7,022,578 B2
(45) Date of Patent: Apr. 4, 2006

(54) HETEROJUNCTION BIPOLAR TRANSISTOR USING REVERSE EMITTER WINDOW

(75) Inventors: Purakh Raj Verma, Singapore (SG); Shao-fu Sanford Chu, Singapore (SG); Lap Chan, Singapore (SG); Jian Xun Li, Singapore (SG); Zhen Jia Zheng, Singapore (SG)

(73) Assignee: Chartered Semiconductor Manufacturing Ltd., Singapore (SG)

(*) Notice: Subject to any disclaimer, the term of this patent is extended or adjusted under 35 U.S.C. 154(b) by 90 days.

(21) Appl. No.: 10/683,713

(22) Filed: Oct. 9, 2003

(65) Prior Publication Data
US 2005/0079678 A1  Apr. 14, 2005

(51) Int. Cl.
*H01L 21/331* (2006.01)

(52) U.S. Cl. ........................ 438/312; 438/320; 438/321

(58) Field of Classification Search ................ 438/312, 438/320, 321, 349; 257/197, 588, 592
See application file for complete search history.

(56) References Cited

U.S. PATENT DOCUMENTS

| | | | |
|---|---|---|---|
| 5,668,022 A * | 9/1997 | Cho et al. ................... 438/320 |
| 6,346,453 B1 | 2/2002 | Kovacic et al. |
| 6,472,262 B1 | 10/2002 | Chantre et al. |
| 6,531,369 B1 | 3/2003 | Ozkan et al. |
| 6,674,149 B1 * | 1/2004 | Ohnishi et al. .............. 257/591 |
| 6,699,741 B1 * | 3/2004 | Sadovnikov et al. ....... 438/197 |
| 6,706,583 B1 * | 3/2004 | Comard ....................... 438/235 |
| 6,762,106 B1 * | 7/2004 | Aoki et al. .................. 438/312 |
| 6,777,302 B1 * | 8/2004 | Chen et al. .................. 438/335 |
| 2001/0039095 A1 | 11/2001 | Marty |
| 2003/0219963 A1 * | 11/2003 | Shen et al. .................. 438/550 |

\* cited by examiner

*Primary Examiner*—Trung Dang
(74) *Attorney, Agent, or Firm*—Mikio Ishimaru

(57) ABSTRACT

A heterojunction bipolar transistor (HBT), and manufacturing method therefor, comprising a semiconductor substrate having a collector region, an intrinsic base region of a compound semiconductive material over the collector region, an extrinsic base region, an emitter structure, an interlevel dielectric layer over the collector region, extrinsic base region and emitter structure, and connections through the interlevel dielectric layer to the base region, the emitter structure, and the collector region. The emitter structure is formed by forming a reverse emitter window over the intrinsic base region, which subsequently is etched to form an emitter window having a multi-layer reverse insulating spacer therein.

10 Claims, 10 Drawing Sheets

2700

```
┌─────────────────────────────────────────────┐
│ PROVIDING A SEMICONDUCTOR SUBSTRATE HAVING A│
│              COLLECTOR REGION               │
│                    2702                     │
└─────────────────────────────────────────────┘
                      │
┌─────────────────────────────────────────────┐
│ FORMING AN INTRINSIC BASE REGION OF A COMPOUND │
│ SEMICONDUCTIVE MATERIAL OVER THE COLLECTOR REGION │
│                    2704                     │
└─────────────────────────────────────────────┘
                      │
┌─────────────────────────────────────────────┐
│ FORMING A REVERSE EMITTER WINDOW OVER A PORTION OF THE │
│          INTRINSIC BASE REGION              │
│                    2706                     │
└─────────────────────────────────────────────┘
                      │
┌─────────────────────────────────────────────┐
│ FORMING AN EXTRINSIC BASE STRUCTURE OVER THE REMAINING │
│       PORTION OF THE INTRINSIC BASE REGION  │
│                    2708                     │
└─────────────────────────────────────────────┘
                      │
┌─────────────────────────────────────────────┐
│ PROCESSING THE REVERSE EMITTER WINDOW TO FORM AN │
│ EMITTER WINDOW HAVING A MULTI-LAYER REVERSE INSULATING │
│              SPACER THEREIN                 │
│                    2710                     │
└─────────────────────────────────────────────┘
                      │
┌─────────────────────────────────────────────┐
│ FORMING AN EMITTER STRUCTURE IN THE EMITTER WINDOW │
│                    2712                     │
└─────────────────────────────────────────────┘
                      │
┌─────────────────────────────────────────────┐
│ FORMING AN INTERLEVEL DIELECTRIC LAYER OVER THE │
│ COLLECTOR REGION, EXTRINSIC BASE REGION AND EMITTER │
│                  STRUCTURE                  │
│                    2714                     │
└─────────────────────────────────────────────┘
                      │
┌─────────────────────────────────────────────┐
│ FORMING CONNECTIONS THROUGH THE INTERLEVEL DIELECTRIC │
│ LAYER TO THE COLLECTOR REGION, THE EXTRINSIC BASE │
│       STRUCTURE, AND THE EMITTER STRUCTURE  │
│                    2716                     │
└─────────────────────────────────────────────┘
```

FIG. 27

HETEROJUNCTION BIPOLAR TRANSISTOR USING REVERSE EMITTER WINDOW

TECHNICAL FIELD

The present invention relates generally to semiconductor technology and more specifically to a method and apparatus for manufacturing heterojunction bipolar transistors.

BACKGROUND ART

A bipolar junction transistor (BJT) is a three-terminal device that can controllably vary the magnitude of the electrical current that flows between two of the terminals. The three terminals include a base terminal, a collector terminal, and an emitter terminal. The movement of electrical charge carriers, which produce electrical current flow between the collector and the emitter terminals, varies dependent upon variations in the voltage on the base terminal thereby causing the magnitude of the current to vary. Thus, the current flow through the emitter and collector terminals is controlled by the voltage across the base and emitter terminals. The terminals of a BJT are connected to their respective base, collector, and emitter structures formed in a semiconductor substrate. BJTs comprise two p-n junctions placed back-to-back in close proximity to each other, with one of the regions common to both junctions. There is a first junction between the base and the emitter, and a second junction between the emitter and the collector. This forms either a p-n-p or n-p-n transistor depending upon the characteristics of the semiconductive materials used to form the HBT.

Recently, demand for BJTs has increased significantly because these transistors are capable of operating at higher speeds and driving more current. These characteristics are important for high-speed, high-frequency communication networks such as those required by cell phones and computers.

BJTs can be used to provide linear voltage and current amplification because small variations of the voltage between the base and emitter terminals, and hence the base current, result in large variations of the current and voltage output at the collector terminal. The transistor can also be used as a switch in digital logic and power switching applications. Such BJTs find application in analog and digital circuits and integrated circuits at all frequencies from audio to radio frequency.

Heterojunction bipolar transistors (HBTs) are BJTs where the emitter-base junction is formed from two different semiconductive materials having similar characteristics. One material used in forming the base-emitter junction preferably is a compound semiconductive material such as silicon-germanium (SiGe) or silicon-germanium-carbon (SiGeC). HBTs using compound semiconductive materials have risen in popularity due to their high-speed and low electrical noise capabilities, coupled with the ability to manufacture them using processing capabilities used in the manufacture of silicon BJTs. HBTs have found use in higher-frequency applications such as cell phones, optical fiber, and other high-frequency applications requiring faster switching transistors, such as satellite communication devices.

Most BJTs, including HBTs, in use today are "double poly" bipolar transistors, which use two polysilicon structures; one for an emitter structure, and a second for a base structure of the transistor.

HBTs are manufactured by implanting a silicon substrate with a dopant to provide a collector region. A silicon layer is then grown or deposited over the collector region. Insulating dividers called shallow-trench isolations (STIs) are formed in the silicon substrate. The STIs define an intrinsic base region over a portion of the collector region.

Subsequently, a first layer of polysilicon is deposited over the silicon substrate and is processed to form a base structure in contact with a portion of the intrinsic base region. One portion of the base structure is formed with an opening in which an emitter structure is subsequently formed.

A first insulating layer is deposited over the base structure and is removed in the opening of the base structure over the intrinsic base region by etching down to the intrinsic base region to form an emitter window. The etching process inherently produces a rough surface on the substrate since the etchants used are not particularly selective between the polysilicon layer forming the base structure and the underlying silicon substrate.

To get higher performance, compound semiconductive materials such as SiGe and SiGeC generally are grown over the insulating layer and on the rough surface of the substrate. The rough surface causes a major problem because the growth of the compound semiconductive material is irregular and its thickness is not constant as a result of the roughness of the substrate. This leads to performance problems with the device and variations in performance from device to device. It also causes junction leakage and more power consumption.

A second layer of polysilicon is deposited into the emitter window over the compound semiconductive materials and processed to form an emitter structure, which is encircled by and overlaps the base structure. The overlap is necessary to provide room for an emitter contact, but it causes another major problem with unwanted capacitance between the emitter and base structures. This capacitance slows down the operation of the HBT.

A dielectric layer is deposited over the emitter structure and is processed to form spacers around the emitter structure. An interlevel dielectric layer (ILD) is then deposited over the emitter and base structures.

Finally, contacts are formed in the ILD that connect with the collector, base, and emitter structures. Terminals are then connected to the contacts.

As previously mentioned, the emitter structure overlaps the base structure because it is necessary to provide room for the emitter contact to be formed. Since it is desirable to make the overlap as small as possible, it is desirable to have the emitter structure as small as possible. However, variations in the size of the emitter contact lead to a further major problem causing performance variations in the HBT from device to device.

Although the use of compound semiconductive materials has proven useful in HBTs, once formed by existing methods, this material is subsequently subjected to multiple thermal cycles, implantations and/or etching processes during the formation process of the remaining elements of the HBT, such as the deposition and etching of oxide layers, nitride layers and subsequently deposited polysilicon layers. Several of these processes inherently damage the compound semiconductive material. Etching polysilicon over a compound semiconductive layer, for example, adversely affects the compound semiconductive material because the etchants used do not selectively etch only the polysilicon. Some of the compound semiconductive material is also etched during this processing, resulting in HBTs that exhibit relatively poor noise performance and in leakage current, which in turn reduces integrated circuit yield.

One attempt to overcome the above mentioned problems involves selective epitaxial growth of the compound semiconductive material only over the active region of the HBT to form a self-aligned epitaxial intrinsic base structure. Selective epitaxy also may be used in a self-aligned emitter-to-base process in which an emitter window is defined by growing an in situ doped epitaxial layer over a patterned thin oxide/nitride pad.

In one method for fabricating a self-aligned double-polysilicon HBT using selective epitaxy, the intrinsic base is grown in the silicon substrate only in the active region of the silicon substrate. A polysilicon layer heavily doped with a dopant of a conductivity type opposite that of the substrate is deposited over the active region of the semiconductor substrate having a given conductivity type to form the emitter of the HBT.

For example, an $n^-$-doped silicon substrate would have p-doped monosilicon layers deposited thereon. This monosilicon layer then has one or more compound semiconductive layers epitaxially grown over it. These layers are then covered with an upper insulating layer, for example silicon dioxide, to form a stack above the active region of the HBT. The epitaxial silicon layers are intended to eventually form the base structure of the HBT. The stack is then etched to define an emitter window. Electrically insulating regions or "reverse spacers" are separately made on the sidewalls of the emitter window. Next, polysilicon is deposited in the emitter window to form the emitter structure. The emitter structure is thus insulated from the extrinsic base structure by the reverse spacers and also by a portion of the upper insulating layer of the stack on which the emitter structure partially rests. This results in a more consistently small-sized emitter structure.

The adverse effects of etching the emitter window still persist however. During the operation of etching the stack, over-etching still occurs. The lack of adequate controls and reproducibility of over-etching typically results in the intrinsic base being thinned down or roughened. Thinning down of the compound semiconductive layer changes its performance resulting in integrated circuit failures or yield loss. Also, the roughness created on the compound semiconductive layer results in leakage current which either increases the power consumption or results in integrated circuit yield loss.

Furthermore, to improve the operating speed of a HBT, it is important that the base structure be thin enough to minimize the time it takes electronic charges to move from the emitter to the collector, thereby minimizing the response time of the HBT. It is also important, however, that the base structure have a high concentration of dopant in order to minimize base resistance. Typically, ion implantation techniques are used to form a base layer. However, this technique has the problem of ion channeling, which limits the minimum thickness of the base layer. Another disadvantage of ion implantation is that the compound semiconductive layer is often damaged by the ions during implantation.

Additionally, high-temperature annealing typically is required to drive dopants into the various material layers. This annealing process, however, alters the profile of concentration levels of the dopants within the various layers of semiconductive materials forming the transistor to create undesirable dopant profiles within the various material layers.

Existing methods of manufacturing HBTs still have the problems associated with over-etching, the detrimental effects of ion implantation and annealing, and consistency during manufacturing. HBTs still exhibit relatively high base resistance and poor noise performance.

Solutions to these problems have been long sought but prior developments have not taught or suggested any solutions and, thus, solutions to these problems have long eluded those skilled in the art.

DISCLOSURE OF THE INVENTION

The present invention provides a heterojunction bipolar transistor (HBT), and manufacturing method therefor, comprising a semiconductor substrate having a collector region, an intrinsic base region of a compound semiconductive material over the collector region, an extrinsic base region, an emitter structure, an interlevel dielectric layer over the collector region, extrinsic base region and emitter structure, and connections through the interlevel dielectric layer to the collector region, the extrinsic base region and the emitter structure. The emitter structure is formed by forming a reverse emitter window over the intrinsic base region, which subsequently is selectively etched to form an emitter window having a multi-layer reverse insulating spacer therein.

The HBT of the present invention overcomes the problems associated with over-etching, the detrimental effects of ion implantation and annealing, and inconsistency of manufacturability experienced in existing methods of manufacture of HBTs. Additionally, in accordance with the present invention, the base of the HBT can be made relatively thicker, for example in excess of 2000 angstroms, which results in reduced base resistance and increased speed and noise performance of the HBT.

Certain embodiments of the invention have other advantages in addition to or in place of those mentioned above. The advantages will become apparent to those skilled in the art from a reading of the following detailed description when taken with reference to the accompanying drawings.

BRIEF DESCRIPTION OF THE DRAWINGS

FIG. 27 is a flow chart of the method of the present invention.

BEST MODE FOR CARRYING OUT THE INVENTION

In the following description, numerous specific details are given to provide a thorough understanding of the invention. However, it will be apparent to one skilled in the art that the invention may be practiced without these specific details. In order to avoid obscuring the present invention, some well-known system configurations, and processes are not disclosed in detail.

Likewise, the drawings showing embodiments of the apparatus are semi-diagrammatic and not to scale and, particularly, some of the dimensions are for the clarity of presentation and are shown greatly exaggerated in the FIGs. Generally, the device can be operated in any orientation.

Figure 1:
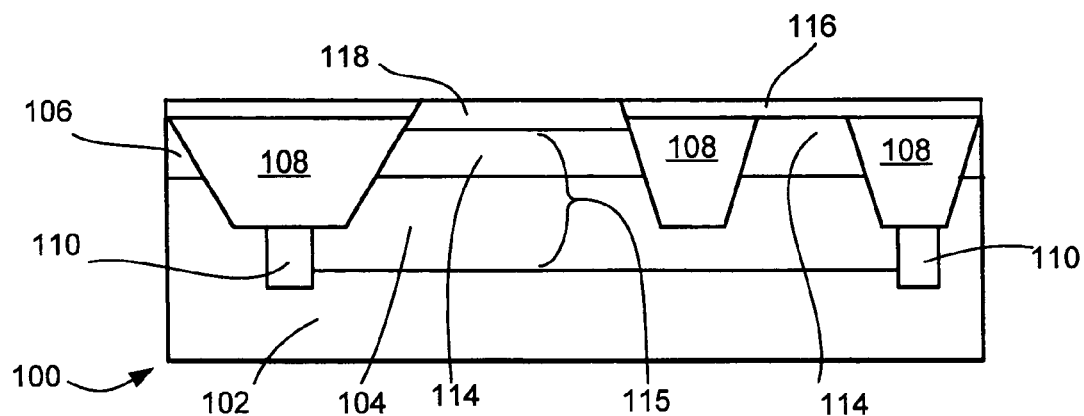
FIG. 1 is a cross-sectional view of a HBT in an intermediate stage of manufacture in accordance with the present invention using selective deposition of a compound semiconductive layer.

Referring now to FIG. 1, therein is shown a cross-sectional view of a heterojunction bipolar transistor (HBT) 100 in an intermediate stage of manufacture in accordance with the present invention using a selective deposition method. A semiconductor substrate 102 has been implanted with a dopant to form a buried collector 104. An epitaxial layer 106 of substrate material has been deposited over the semiconductor substrate 102 and the buried collector 104.

The term "horizontal" as used in herein is defined as a plane parallel to the conventional plane or surface of a wafer or substrate, regardless of its orientation. The term "vertical" refers to a direction perpendicular to the horizontal as just defined. Terms, such as "on" "above", "below", "side" (as in "sidewall"), "higher", "lower", "over", and "under", are defined with respect to the horizontal plane. The term "beside" refers to two structures, which are side by side with neither overlapping the other.

The HBT 100 has also had insulating dividers formed into the semiconductor substrate 102 and the epitaxial layer 106 that form a plurality of shallow trench isolations (STIs) 108. Beneath the plurality of STIs 108 are located a plurality of deep trench isolations (DTIs) 110. A portion of the epitaxial layer 106 has a lower concentration of a similar type of doping as that of the buried collector 104 and forms a sub-collector region 114. Collectively, the buried collector 104 and the sub-collector region 114 will be referred to as a collector region 115.

A first insulating layer 116, such as an oxide layer, has been deposited over the epitaxial layer 106. The first insulating layer 116 has also been processed, for example by a high selectivity etch, to expose a surface over the sub-collector region 114 onto which is selectively deposited or grown an intrinsic base region 118. The intrinsic base region 118 is a compound semiconductive material such as silicon germanium (SiGe), silicon germanium carbon (SiGeC), or a combination thereof.

The term "processing", or "processed" as used herein includes deposition of material or photoresist, patterning, exposure, development, etching, cleaning, and/or removal of the material or photoresist as required in forming a described structure.

In one embodiment for a HBT, the semiconductor substrate 102 is lightly p⁻ doped and the sub-collector region 114 is lightly n⁻ doped. The buried collector 104 has n⁺ doping. The plurality of STIs 108 can be conventional STI trenches with grown oxide liners filled with deposited oxide. The first insulating layer 116 preferably is silicon dioxide.

Since a highly selective wet etch can be used to remove the first insulating layer 116 from the epitaxial layer 106 forming the sub-collector region 114 without adversely effecting the epitaxial layer 106, the epitaxial layer 106 will be essentially unetched, thus providing an area for placement of the compound semiconductive material which is extremely smooth for later processing. Use of the first insulating layer 116 thereby overcomes a problem in existing methods that attempt to selectively etch the compound semiconductive material after deposition of the compound semiconductive material onto the semiconductor substrate 102; e.g., trying to selectively etch a silicon compound over a silicon substrate.

Figure 2:
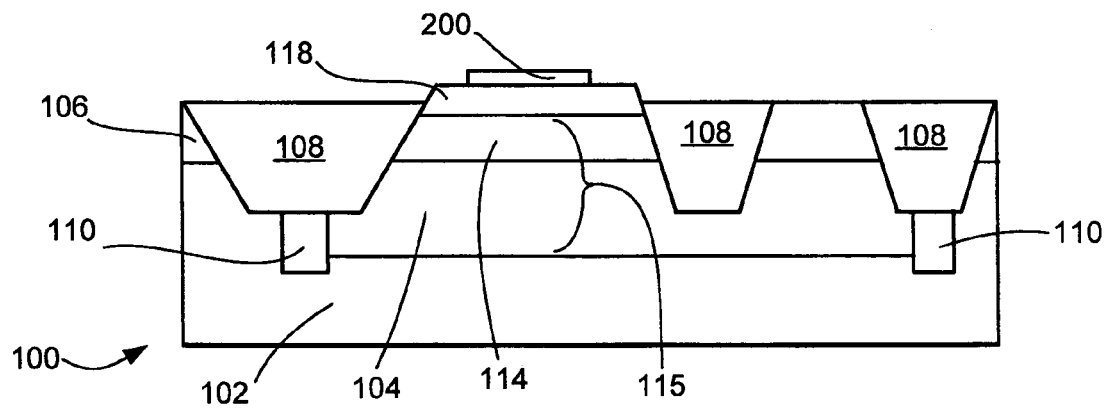
FIG. 2 is the structure of FIG. 1 after deposition and processing of a first insulating layer over a portion of the compound semiconductive layer.

Referring now to FIG. 2, therein is shown the structure of FIG. 1 after deposition and processing of a second insulating layer 200 over a portion of the intrinsic base region 118.

Figure 3:
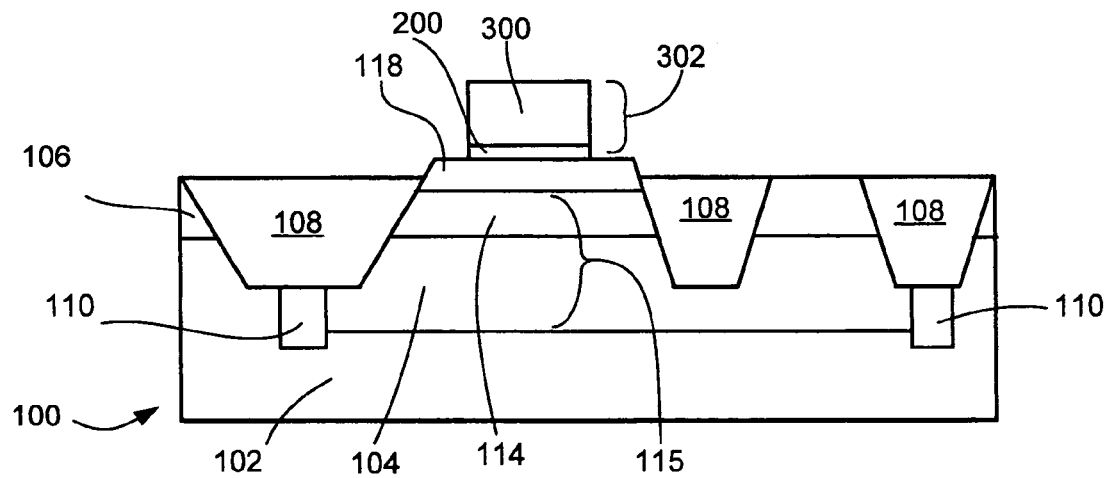
FIG. 3 is the structure of FIG. 2 after deposition of a second insulating layer over the first insulating layer to form a reverse emitter window.

Referring now to FIG. 3, therein is shown the structure of FIG. 2 after deposition of a third insulating layer 300, such as a nitride layer, over the second insulating layer 200. The second insulating layer 200 and the third insulating layer 300 are then processed to form a reverse emitter window 302.

Figure 4:
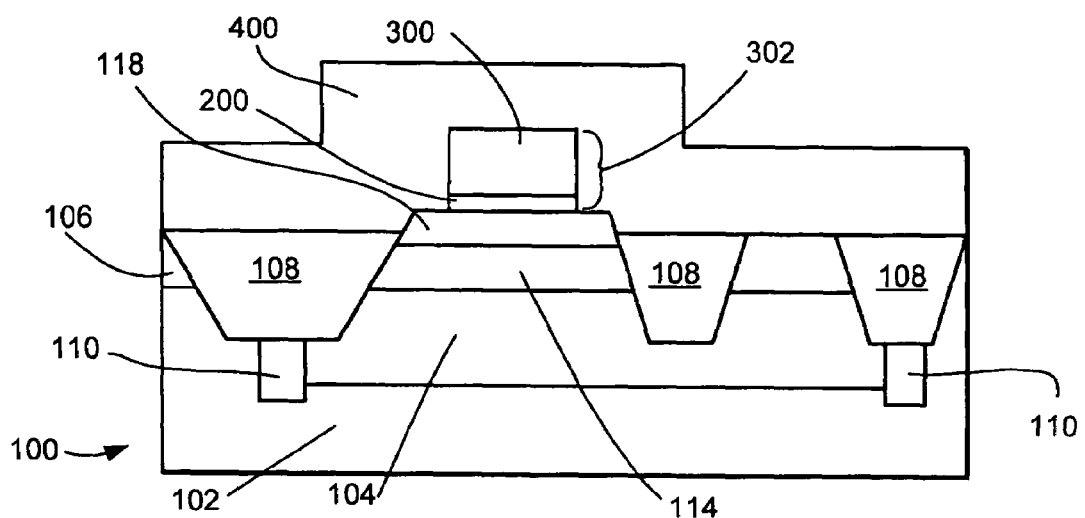
FIG. 4 is the structure of FIG. 3 after deposition of a polysilicon layer.

Referring now to FIG. 4, therein is shown the structure of FIG. 3 after deposition of a polysilicon layer 400. The polysilicon layer 400 covers the portion of the intrinsic base region 118 not covered by the reverse emitter window 302 as well as the reverse emitter window 302.

Figure 5:
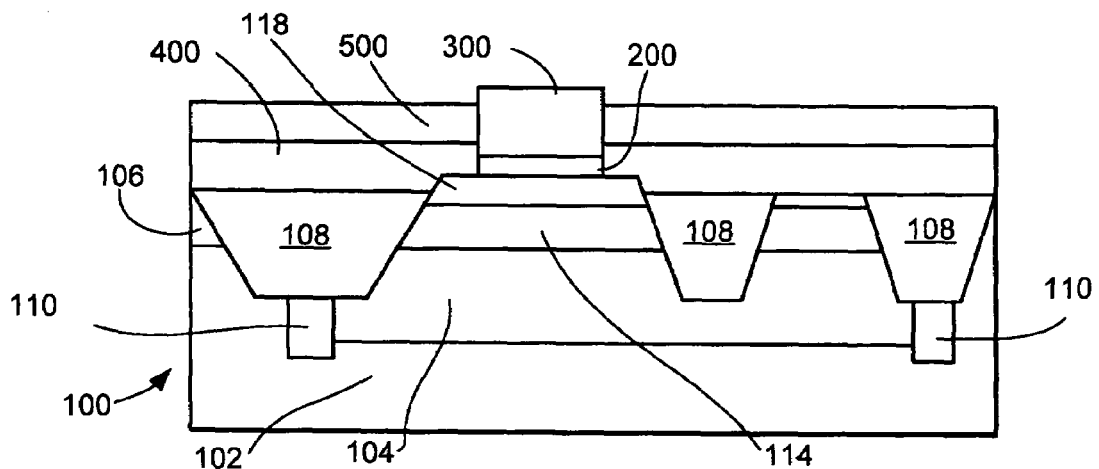
FIG. 5 is the structure of FIG. 4 after processing of the polysilicon layer.

Referring now to FIG. 5, therein is shown the structure of FIG. 4 after processing of the polysilicon layer 400. The polysilicon layer 400 undergoes a chemical mechanical polish (CMP) to level the upper surface of the polysilicon layer 400 with the upper surface of the third insulating layer 300. Then the polysilicon layer 400 is recessed below the upper surface of the third insulating layer 300 using a short etching process. A fourth insulating layer 500 is then formed over the polysilicon layer 400, such as by either growing a silicon dioxide layer at low temperature, or depositing a TEOS layer which is then polished using CMP and then recessed below the upper surface of the third insulating layer 300.

Figure 6:
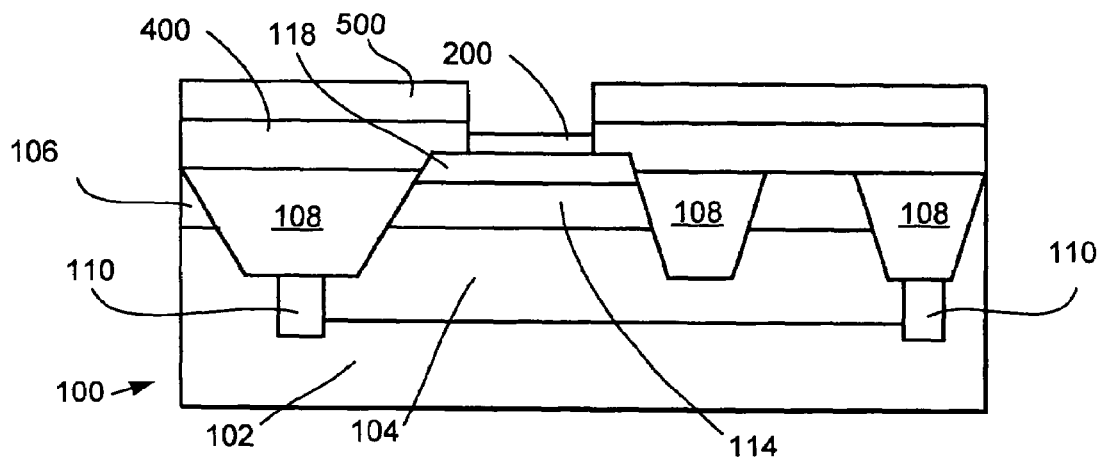
FIG. 6 is the structure of FIG. 5 after the second insulating layer is removed.

Referring now to FIG. 6, therein is shown the structure of FIG. 5 after the third insulating layer 300 is removed by etching. For example, if the third insulating layer 300 is a nitride layer the etching process can be performed using phosphoric acid.

Figure 7:
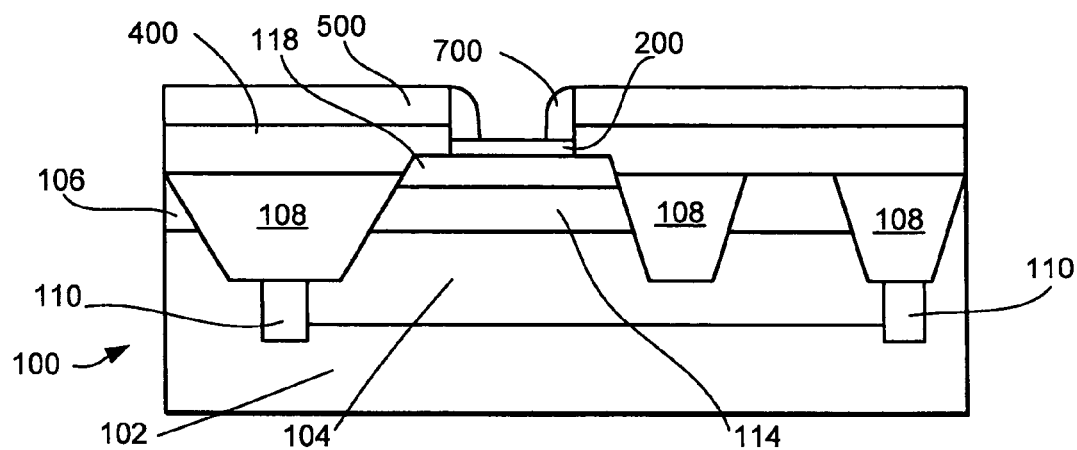
FIG. 7 is the structure of FIG. 6 after formation of a reverse spacer above the first insulating layer.

Referring now to FIG. 7, therein is shown the structure of FIG. 6 after formation of a reverse spacer 700 above the second insulating layer 200. The reverse spacer 700 is formed, such as by depositing a fifth insulating layer over the second insulating layer 200, and then anisotropically etching the fifth insulating layer to form the reverse spacer 700.

Figure 8:
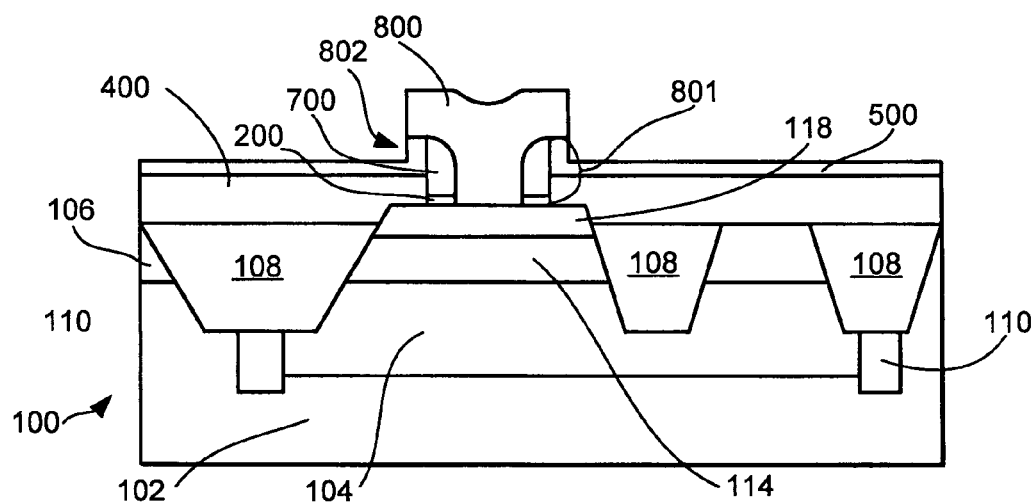
FIG. 8 is the structure of FIG. 7 after formation of a multi-layer reverse insulating spacer and an emitter structure.

Referring now to FIG. 8, therein is shown the structure of FIG. 7 after formation of an emitter structure 800. The second insulating layer 200 that is not covered by the reverse spacer 700 is removed, such as by being etched thereby exposing a portion of the intrinsic base region 118 at the bottom of the emitter window. For example, if the second insulating layer 200 is an oxide layer, the etch can be performed using a dilute hydrofluoric acid (DHF). There is thus formed a multi-layer reverse insulating spacer 801. The emitter structure 800 is formed, for example, by depositing a layer of n⁺ doped polysilicon, which is then processed to form the emitter structure 800. The fourth insulating layer 500 is also partially recessed by etching using the emitter structure 800 that has just been formed as a mask for this etching process. A second spacer 802 is thus formed around the upper portion of the reverse spacer 700 to provide an additional dielectric layer between the emitter structure 800 and the polysilicon layer 400.

Figure 9:
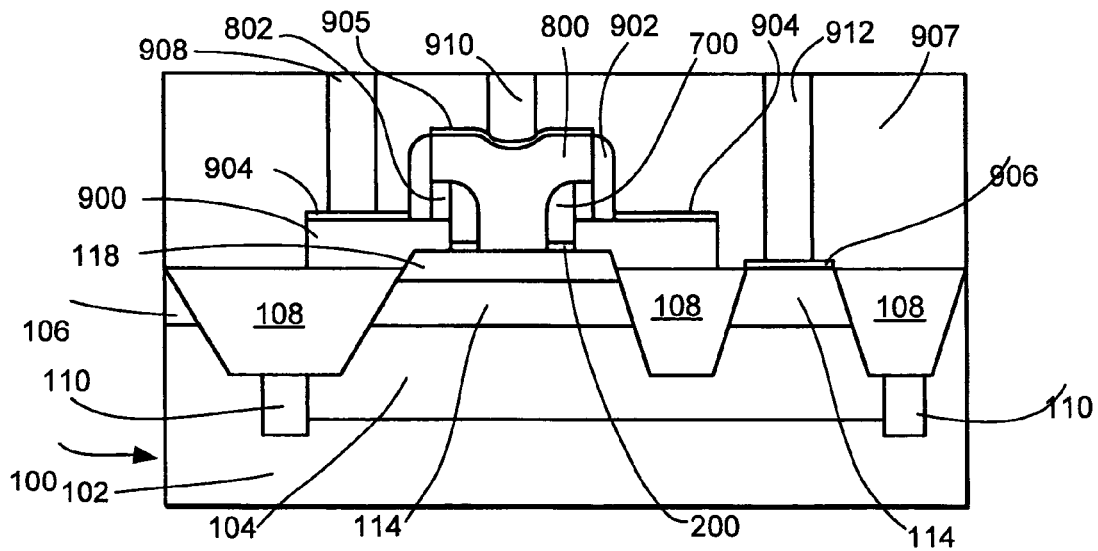
FIG. 9 is the structure of FIG. 8 after forming a base contact, an emitter contact, and a collector contact.

Referring now to FIG. 9, therein is shown the structure of FIG. 8 after processing the polysilicon layer 400 to form an extrinsic base structure 900. The extrinsic base structure 900 is formed beside, and specifically not under, the emitter structure 800. The extrinsic base structure 900 contacts the intrinsic base region 118 so the portion of the compound semiconductive material that contacts the extrinsic base structure 900 functions as part of the extrinsic base of the HBT 100. Also, a third spacer 902 may be formed around the emitter structure 800. A first salicide layer 904 is formed over the extrinsic base structure 900. A second salicide layer 905 is formed over the emitter structure 800, and a third salicide layer 906 is formed over the sub-collector region 114. The first salicide layer 904, the second salicide layer 905 and the third salicide layer 906 are formed using conventional techniques of forming a silicide. The material used to form the salicide layers may be any suitable material used for such a purpose such as, for example, a cobalt-titanium-nitride alloy (CoTiN) silicide.

An interlevel dielectric (ILD) layer 907 has been deposited over the structure of FIG. 8. Openings in the ILD layer 907 have been formed for the various contacts. A base contact 908 has been deposited through the ILD layer 907 onto the first salicide layer 904 over the extrinsic base structure 900. An emitter contact 910 has been deposited through the ILD layer 907 onto the second salicide layer 905 over the emitter structure 800. A collector contact 912 has been deposited through the ILD layer 907 onto the third salicide layer 906 over the sub-collector region 114.

Figure 10:
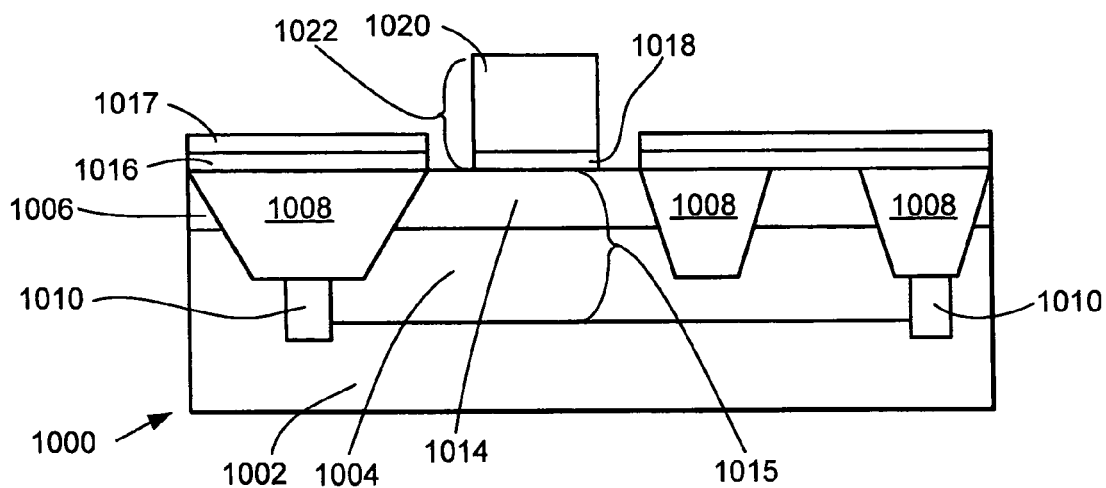
FIG. 10 is a cross-sectional view of an alternate embodiment of a HBT in an intermediate stage of manufacture in accordance with the present invention using selective deposition of the compound semiconductive layer.

Referring now to FIG. 10, therein is shown a cross-sectional view of an alternate embodiment of a HBT 1000 in an intermediate stage of manufacture in accordance with the present invention using a selective deposition method. The HBT 1000 includes a semiconductor substrate 1002 that has been implanted with a dopant to form a buried collector 1004. An epitaxial layer 1006 of substrate material has been deposited over the semiconductor substrate 1002 and the buried collector 1004.

The HBT 1000 also has insulating dividers formed into the semiconductor substrate 1002 and the epitaxial layer 1006 that form a plurality of shallow trench isolations (STIS) 1008. Beneath the plurality of STIs 1008 are located a plurality of deep trench isolations (DTIs) 1010. A portion of the epitaxial layer 1006 has a lower concentration of a similar type of doping as that of the buried collector 1004 and forms a sub-collector region 1014. Collectively, the buried collector 1004 and the sub-collector region 1014 will be referred to as a collector region 1015.

In an npn transistor, for example, the semiconductor substrate 1002 is lightly p⁻ doped and the sub-collector region 1014 is lightly n⁻ doped. The buried collector 1004 has n+doping. The plurality of STIs 1008 can be conventional STI trenches with grown oxide liners filled with deposited oxide. A first insulating layer 1016, such as silicon dioxide, is deposited of grown over the plurality of STIs 1008 and the sub-collector region 1014. The first insulating layer 1016 can be a gate oxide (gate-ox) layer or a sacrificial oxide (sac-ox) layer. A seed layer 1017, such as an amorphous polysilicon layer, is deposited over the first insulating layer 1016. The seed layer 1017 and the first insulating layer are processed to expose the sub-collector region 1014. A second insulating layer 1018, such as a TEOS layer and a third insulating layer 1020, such as a nitride layer, are deposited and patterned using an emitter mask to form a reverse emitter window 1022 over a portion of the sub-collector region 1014. The third insulating layer 1020 preferably can be processed using a dry etch process while the second insulating layer 1018 preferably is processed using a wet etch process. The wet etch process can be very selective to the epitaxial layer 1006, so the sub-collector region 1014 is not harmed during the etch process, and therefore remains smooth for further processing.

Figure 11:
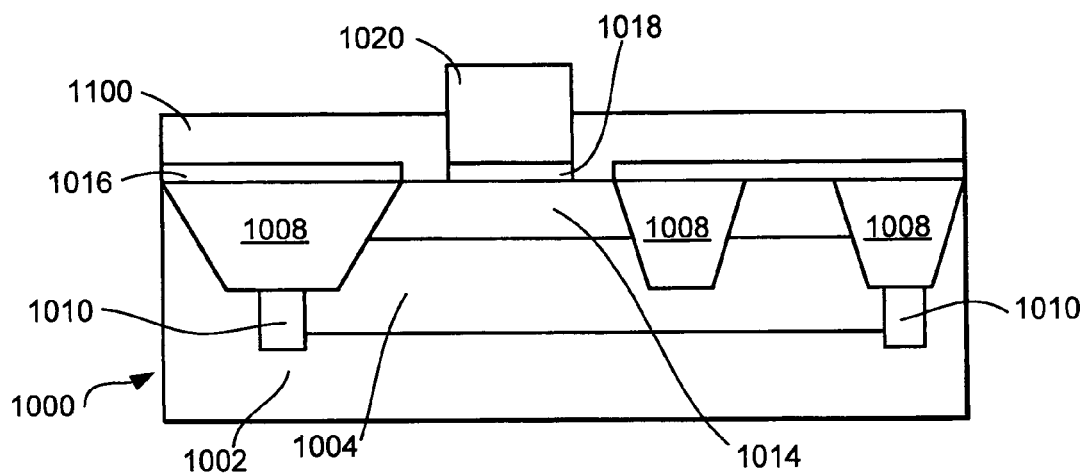
FIG. 11 is the structure of FIG. 10 after an amorphous polysilicon layer has been selectively grown.

Referring now to FIG. 11 therein is shown the structure of FIG. 10 after an amorphous polysilicon layer 1100 has been selectively grown on top of the structure of FIG. 10 in a low temperature process. The amorphous polysilicon layer 1100 is pre-doped during the growth process and then doped further to form a p⁺ layer for the extrinsic base of the HBT 1000. Preferably the amorphous polysilicon layer 1100 has a thickness of greater than about 2000 Angstroms. It has been discovered that this structure results in the HBT 1000 having low base resistance with reduced electrical noise characteristics during operation of the HBT 1000. The amorphous polysilicon layer 1100 also can be used for the gate electrode in CMOS transistors (not shown) located elsewhere on the semiconductor substrate 1002.

Figure 12:
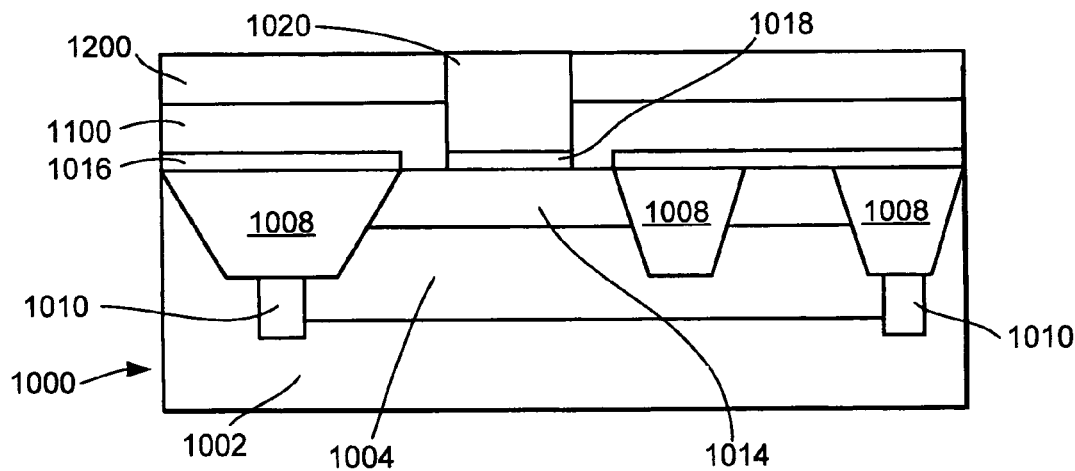
FIG. 12 is the structure of FIG. 11 after processing of a first insulating layer on top of the amorphous polysilicon layer.

Referring now to FIG. 12 therein is shown the structure of FIG. 11 after processing of a fourth insulating layer 1200, such as an oxide layer on top of the amorphous polysilicon layer 1100. The fourth insulating layer 1200 can be either grown in a wet or partially wet environment, or a TEOS layer can be deposited and subsequently processed by a CMP process to provide the fourth insulating layer 1200 that is substantially coplanar with the upper surface of the third insulating layer 1020.

Figure 13:
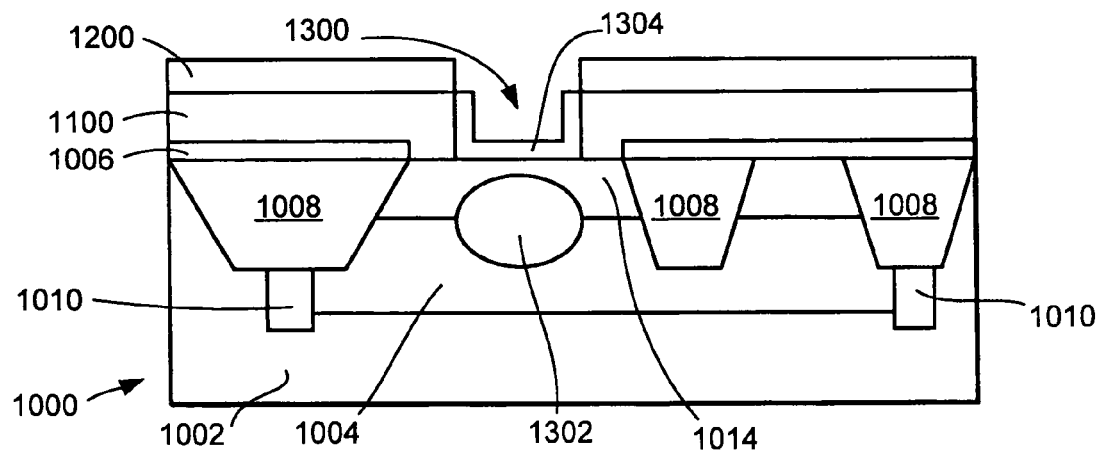
FIG. 13 is the structure of FIG. 12 after a reverse emitter window has been processed to form a multi-layer reverse insulating layer.

Referring now to FIG. 13 therein is shown the structure of FIG. 12 after an emitter window 1300 has been formed. The third insulating layer 1020 shown in FIG. 12 has been removed using an etching process. For example, if the third insulating layer 1020 is a nitride layer, the third insulating layer 1020 can be removed using a phosphoric acid etch. The second insulating layer 1018 shown in FIG. 12 has been removed using another etch process. If the second insulating layer 1018 is an oxide layer, the second insulating layer 1018 can be removed using a DHF etch process. The emitter window 1300 is thus formed.

A selective intrinsic collector (SIC) 1302 can be implanted at this point if required to enhance the performance of the HBT 1000. An intrinsic base layer 1304 is then selectively grown at the bottom of the emitter window 1300. The intrinsic base layer 1304 is formed, for example, by depositing a compound semiconductive material selected from the group consisting of SiGe, SiGeC, and combinations thereof. The intrinsic base layer 1304 is grown in situ and may be doped during the growth process to avoid both ion implantation and high temperature processing, such as annealing. During the selective growth process the semiconductive material also forms to some extent on the sidewalls of the emitter window 1300.

Figure 14:
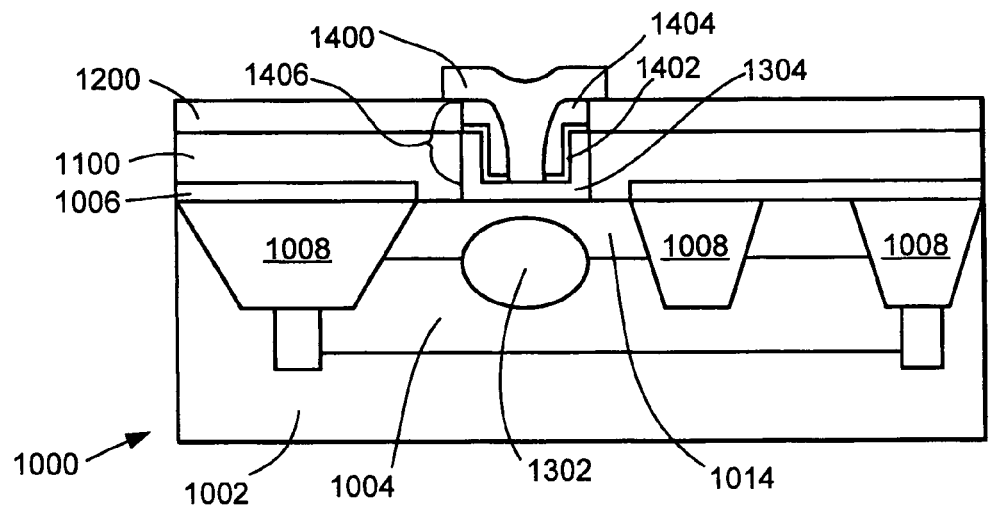
FIG. 14 is the structure of FIG. 13 after formation of an emitter structure.

Referring now to FIG. 14 therein is shown the structure of FIG. 13 after formation of an emitter structure 1400. A first insulating reverse spacer 1402, such as an oxide reverse spacer, is formed, for example, by depositing or growing a fourth insulating layer in the emitter window 1300 shown in FIG. 13 over the intrinsic base layer 1304, and then etching the fourth insulating layer to form the first insulating reverse spacer 1402. A second insulating reverse spacer 1404 is then formed on the interior of the first insulating reverse spacer 1402, such as by depositing a fifth insulating layer in the emitter window 1300 shown in FIG. 13 on top of the first insulating reverse spacer 1402, and then etching the fifth insulating layer to form the second insulating reverse spacer 1404. Thus a multi-layer reverse insulating spacer 1406 comprising the first insulating reverse spacer 1402 and the second insulating reverse spacer 1404 is formed around the periphery of the emitter window 1300. The intrinsic base layer 1304 is then exposed. A polysilicon layer is then formed, for example, by either depositing or growing a layer of polysilicon to fill the remaining portion of the emitter window 1300 patterned using an emitter mask (Poly 2 mask) and then processed to form the emitter structure 1400.

Figure 15:
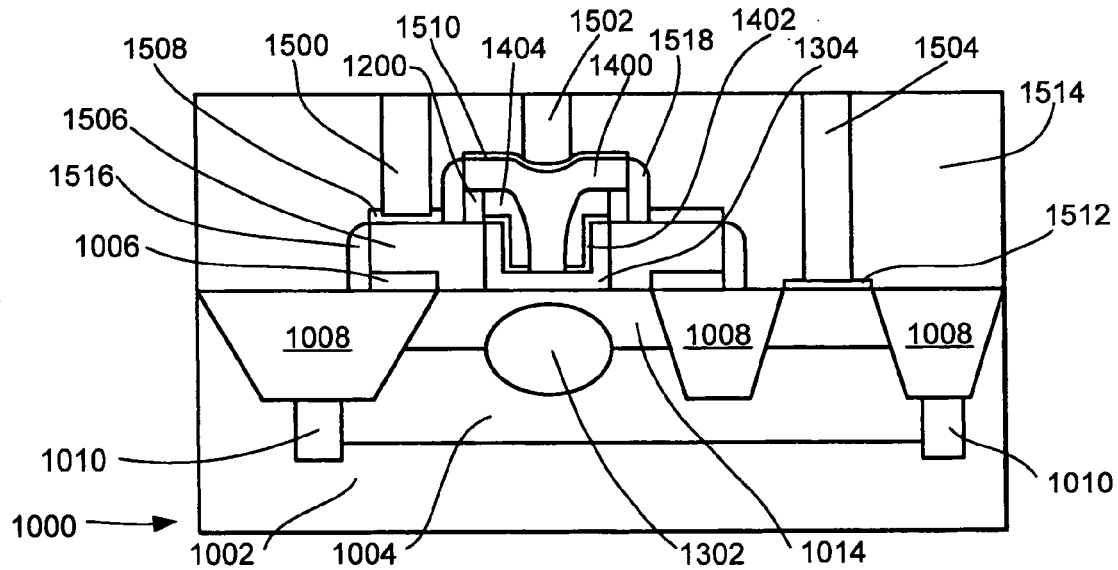
FIG. 15 is the structure of FIG. 14 after forming a base contact, an emitter contact, and a collector contact.

Referring now to FIG. 15 therein is shown the structure of FIG. 14 after forming a base contact 1500, an emitter contact 1502 and a collector contact 1504. A gate mask (Poly 1 mask) is used to process the fourth insulating layer 1200 and the amorphous polysilicon layer 1100 shown in FIG. 14 to form an extrinsic base structure 1506. The Poly 1 mask can also be used to form the source and drain regions of CMOS transistors (not shown) that are formed elsewhere on the semiconductor substrate 1002. Accordingly, the HBT 1000 and the CMOS transistors in a BiCMOS device can be formed using only two poly masks. A rapid thermal anneal (RTA) process can then be used to drive dopants into both the emitter structure 1400 and the source/drain regions of the CMOS transistors on the device.

A salicide process is carried out to cover the areas for the various contacts. The extrinsic base structure 1506 is covered by a first salicide layer 1508. The emitter structure 1400 is covered by a second salicide layer 1510, and a portion of the sub-collector region 1014 is covered by a third salicide layer 1512.

A base insulating spacer 1516, such as an oxide spacer, can optionally be formed around the extrinsic base structure 1506 of the HBT 1000, and an emitter insulating spacer 1518, such as an oxide spacer, can optionally be formed around the emitter structure 1400 to provide additional insulation. An ILD layer 1514 is formed over the surface of the HBT 1000. Openings in the ILD layer 1514 have been made for the various contacts. The base contact 1500 has been deposited through the ILD layer 1514 onto the first salicide layer 1508 over the extrinsic base structure 1506. The emitter contact 1502 has been deposited through the ILD layer 1514 onto the second salicide layer 1510 over the emitter structure 1400. The collector contact 1504 has been deposited through the ILD layer 1514 onto the third salicide layer 1512 over the sub-collector region 1014.

Figure 16:
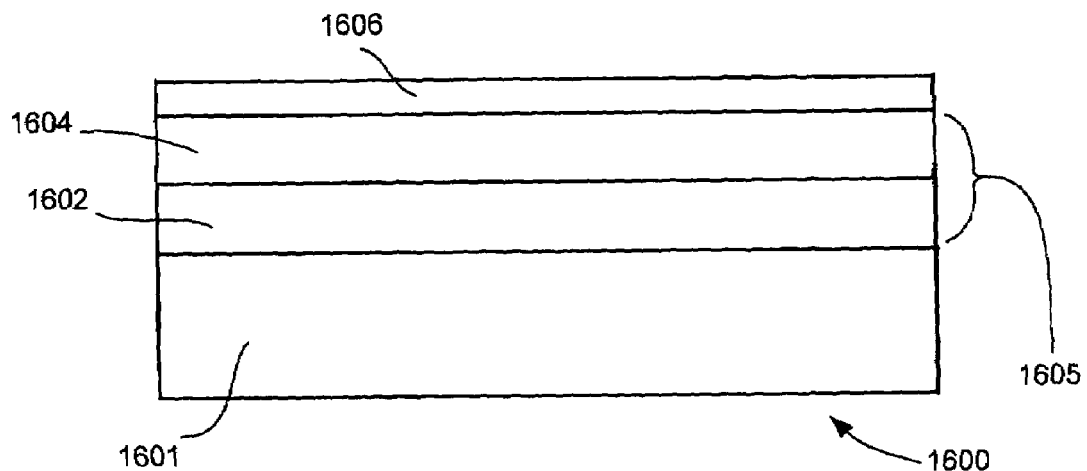
FIG. 16 is a cross-sectional view of a further alternate embodiment of a HBT in an intermediate stage of manufacture in accordance with the present invention using field deposition of the compound semiconductive layer.

Referring now to FIG. 16 therein is shown a further embodiment of a HBT 1600 in an intermediate stage of manufacture in accordance with the present invention using a field deposition method. A semiconductor substrate 1601 has been implanted with a dopant to form a buried collector 1602. Additional doping of a lighter concentration of the dopant used to form the buried collector 1602 is processed to form a sub-collector region 1604. Together the buried collector 1602 and the sub-collector region 1604 form a collector region 1605. An epitaxial layer 1606 of a compound semiconductive material selected from the group consisting of SiGe, SiGeC, and combinations thereof has been deposited over the entire field of the semiconductor substrate 1601 over the sub-collector region 1604.

Figure 17:
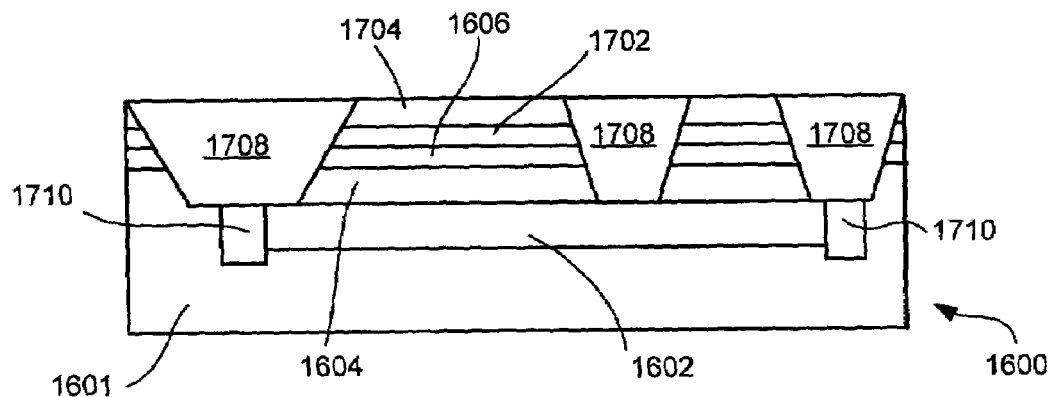
FIG. 17 is the structure of FIG. 16 after formation of a first insulating layer and a second insulating layer.

Referring now to FIG. 17 therein is shown the structure of FIG. 16 that has been processed to form a first insulating layer 1702, such as an oxide layer, over the epitaxial layer 1606 and a second insulating layer 1704, such as a nitride layer, over the first insulating layer 1702. The HBT 1600 also has insulating dividers formed into the semiconductor substrate 1601, the sub-collector region 1604, the epitaxial layer 1606, the first insulating layer 1702 and the second insulating layer 1704 that form a plurality of STIs 1708. Beneath the plurality of STIs 1708 are located a plurality of DTIs 1710.

In one embodiment for an npn transistor, the semiconductor substrate 1601 is lightly p⁻doped and the sub-collector region 1604 is the upper portion of the semiconductor substrate 1601 that has been lightly n⁻ doped. The buried collector 1602 has n⁺ doping. The plurality of STIs 1708 can be conventional STI trenches with grown oxide liners filled with deposited oxide.

Figure 18:
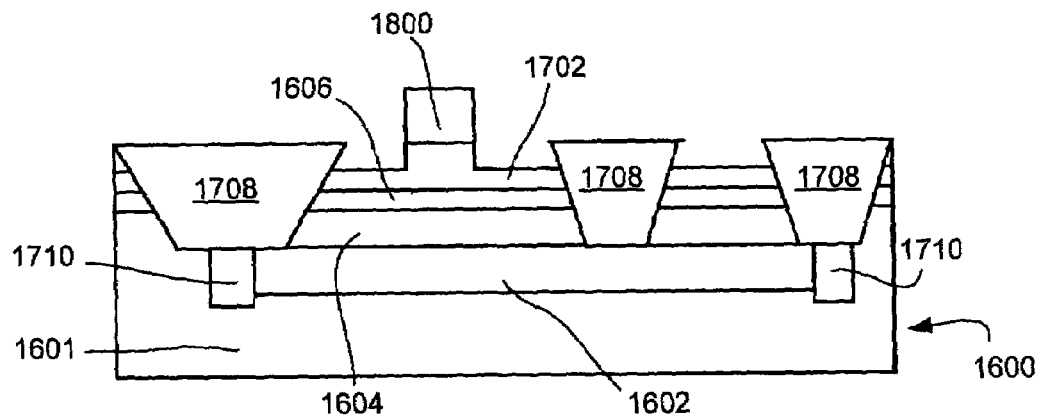
FIG. 18 is the structure of FIG. 17 after formation of a reverse emitter window.

Referring now to FIG. 18, therein is shown the structure of FIG. 17 after formation of a reverse emitter window 1800. The second insulating layer 1704 has been patterned and etched to form the reverse emitter window 1800. The first insulating layer 1702 has then been processed to reduce the thickness of the first insulating layer 1702 to a level below the upper surfaces of the plurality of STIs 1708.

Figure 19:
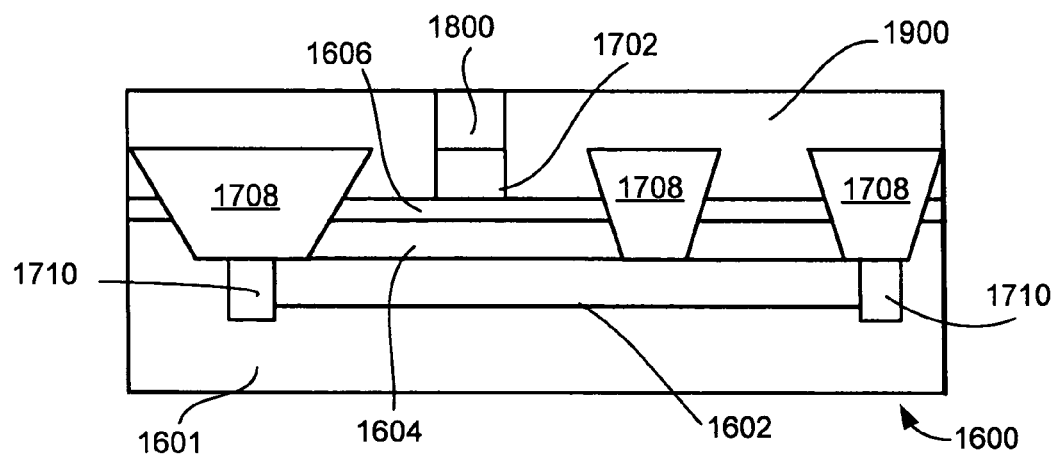
FIG. 19 is the structure of FIG. 18 after deposition of a polysilicon layer.

Referring now to FIG. 19, therein is shown the structure of FIG. 18 after etching of the first insulating layer 1702 that is remaining, and deposition of a polysilicon layer 1900 over the epitaxial layer 1606. The polysilicon layer 1900 has been planarized using conventional CMP techniques to form the polysilicon layer that is coplanar with the upper surface of the reverse emitter window 1800. The polysilicon layer 1900 has p⁺ doping that can be added during deposition of the polysilicon layer 1900.

Figure 20:
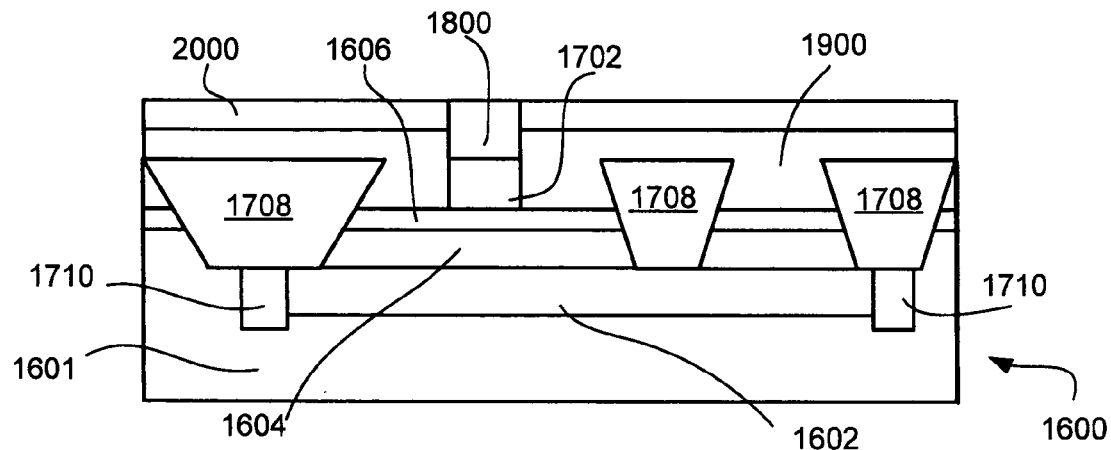
FIG. 20 is the structure of FIG. 19 after further processing of the polysilicon layer.

Referring now to FIG. 20, therein is shown the structure of FIG. 19 after further processing of the polysilicon layer 1900. The polysilicon layer 1900 is recessed from the upper level of the reverse emitter window 1800 using a short etching process. A third insulating layer 2000 is then formed over the polysilicon layer 1900 by either growing an insulating layer, such as a silicon dioxide layer at low temperature, or depositing an insulating layer, such as a TEOS layer which is then planarized using CMP to be coplanar with the top of the reverse emitter window 1800.

Figure 21:
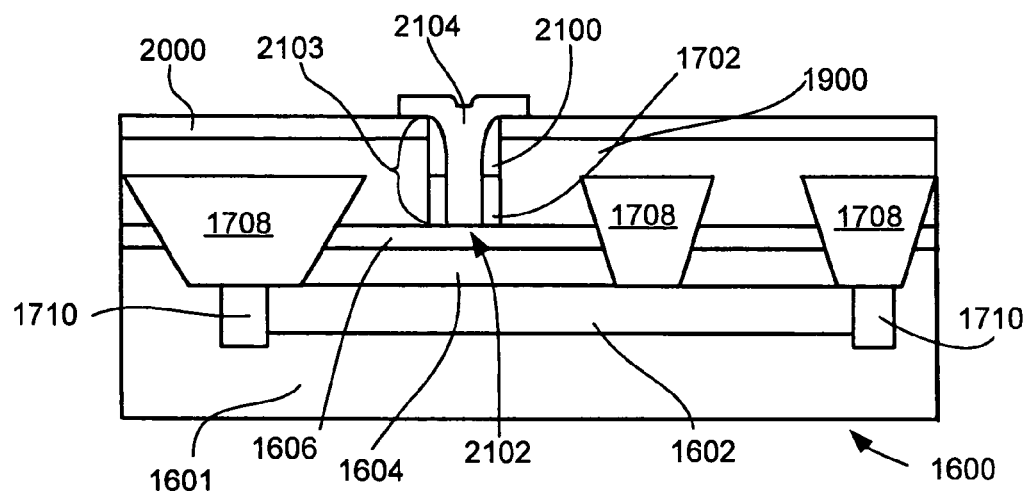
FIG. 21 is the structure of FIG. 20 after the reverse emitter window is anisotropically etched to form a multi-layer reverse insulating spacer.

Referring now to FIG. 21, therein is shown the structure of FIG. 20 after the second insulating layer 1704 forming a part of the reverse emitter window 1800 shown in FIG. 20 is anisotropically etched to form an insulating reverse spacer 2100. The first insulating layer 1702 that is not covered by the reverse insulating spacer 2100 is etched thereby exposing a portion of the epitaxial layer 1606. An emitter window 2102 having a multi-layer reverse insulating spacer 2103 is thus formed. An emitter structure 2104 is then formed in the emitter window 2102, for example, by depositing a doped polysilicon layer into the emitter window and on the surface of the third insulating layer 2000. The doped polysilicon layer is then patterned and etched to form the emitter structure 2104. Thus, the portion of the epitaxial layer 1606 under the emitter structure 2104 forms the intrinsic base of the HBT 1600.

Figure 22:
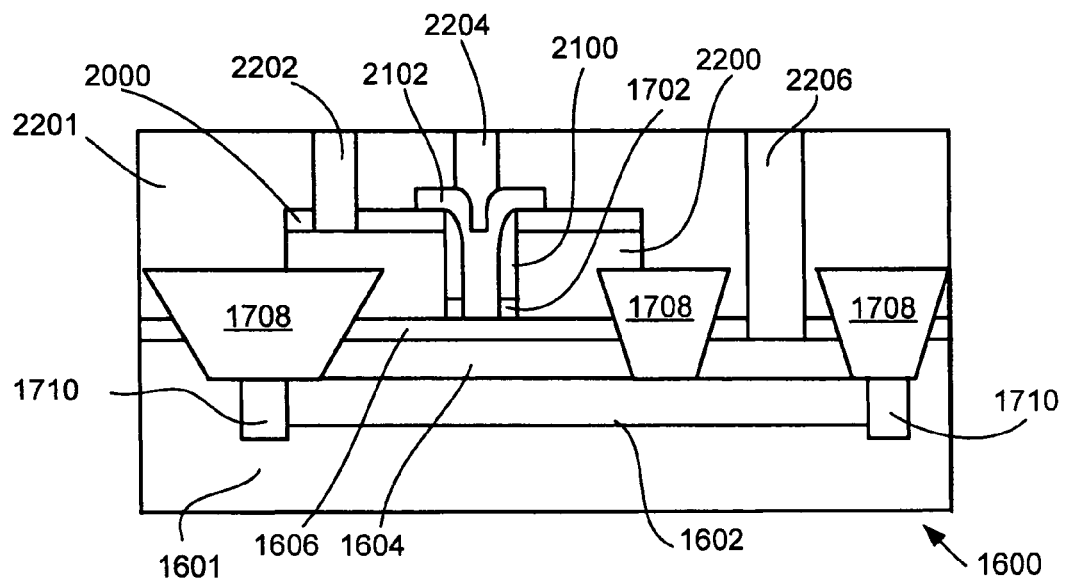
FIG. 22 is the structure of FIG. 21 after forming a base contact, an emitter contact, and a collector contact.

Referring now to FIG. 22, therein is shown the structure of FIG. 21 after processing the polysilicon layer 1900 to form an extrinsic base structure 2200 and an ILD layer 2201. The extrinsic base structure 2200 is formed beside, and specifically not under, the emitter structure 2104. The extrinsic base structure 2200 contacts the epitaxial layer 1606 so the portion of the epitaxial layer 1606 that is in contact with the extrinsic base structure 2200 functions as part of the extrinsic base of the HBT 1600.

The ILD layer 2201 has been deposited and openings in the ILD layer 2201 have been formed for the various contacts. A base contact 2202 has been deposited through the ILD layer 2201 and the insulating layer 2000 into contact with the extrinsic base structure 2200. An emitter contact 2204 has been deposited through the ILD layer 2201 into contact with the emitter structure 2104. A collector contact 2206 has been deposited through the ILD layer 2201 into contact with the sub-collector region 1604.

Figure 23:
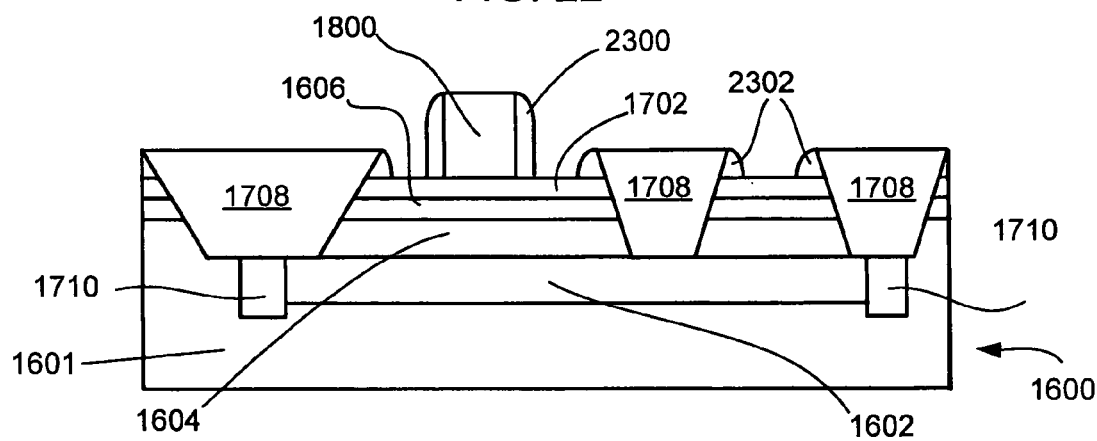
FIG. 23 is the structure of FIG. 18 after formation of an insulating spacer around the reverse emitter window in accordance with a further alternate embodiment of the present invention.

Referring now to FIG. 23, therein is shown the structure of FIG. 18 after formation of an insulating spacer 2300, such as an oxide spacer, around the reverse emitter window in accordance with an alternate embodiment of the present invention. The insulating spacer 2300 is formed, for example, by first depositing or growing a first insulating layer and then using a CMP process so the first insulating layer is substantially coplanar with the upper surface of the reverse emitter window 1800. The first insulating layer is then etched to form the insulating spacer 2300 around the reverse emitter window 1800.

Figure 24:
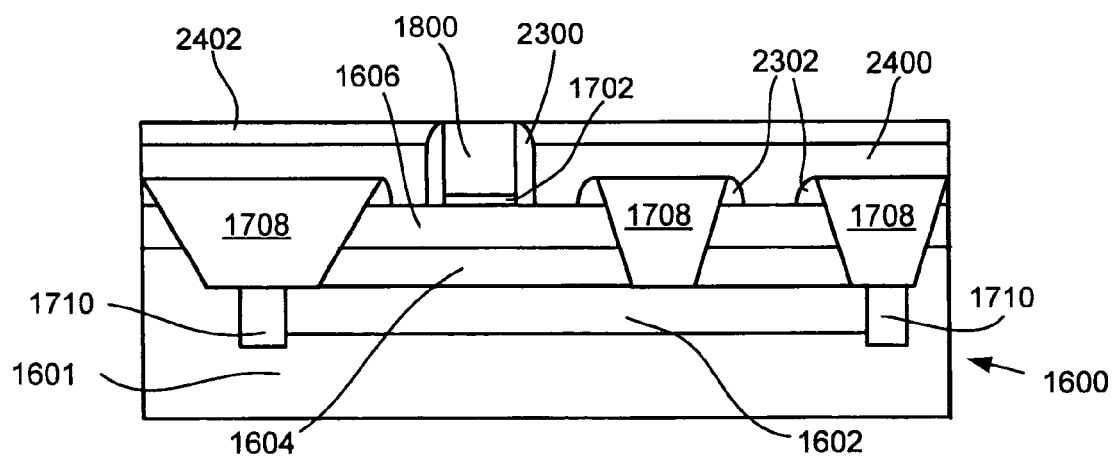
FIG. 24 is the structure of FIG. 23 after formation of a polysilicon layer and an insulating layer.

Referring now to FIG. 24, therein is shown the structure of FIG. 23 after formation of a polysilicon layer 2400 and a second insulating layer 2402. The polysilicon layer 2400 is formed, for example, by depositing polysilicon and recessing it below the upper surface of the reverse emitter window 1800. The second insulating layer 2402 is then formed by deposition and performing a CMP so the second insulating layer 2402 is substantially coplanar with the upper surface of the reverse emitter window 1800.

Figure 25:
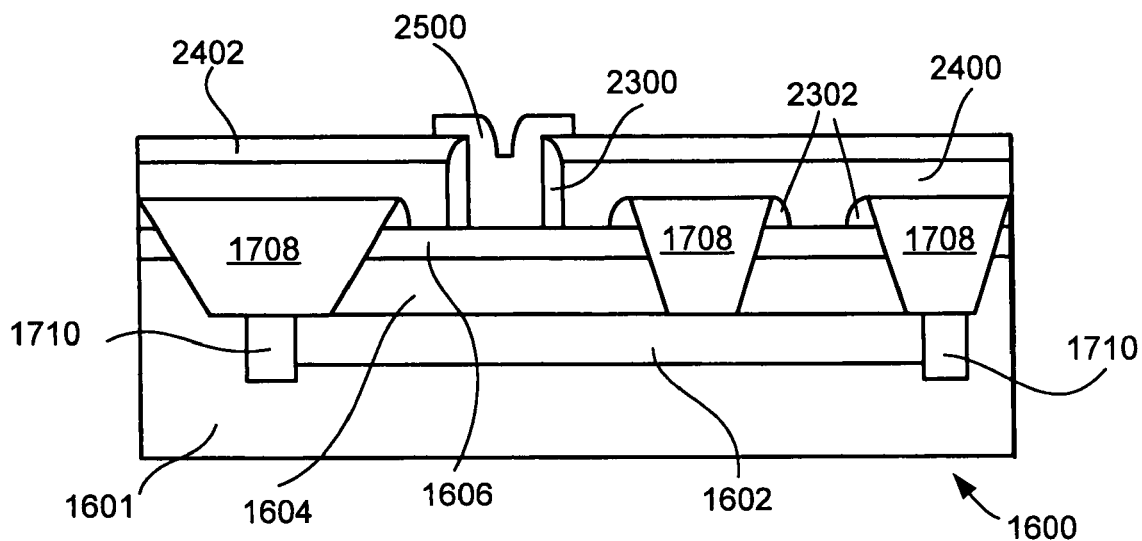
FIG. 25 is the structure of FIG. 24 after formation of an emitter structure.

Referring now to FIG. 25, therein is shown the structure of FIG. 24 after formation of an emitter structure 2500. The emitter structure 2500 is formed by etching the reverse emitter window 1800 in FIG. 24 and then depositing or growing a doped polysilicon layer. The polysilicon layer is then patterned and etched to form the emitter structure 2500.

Figure 26:
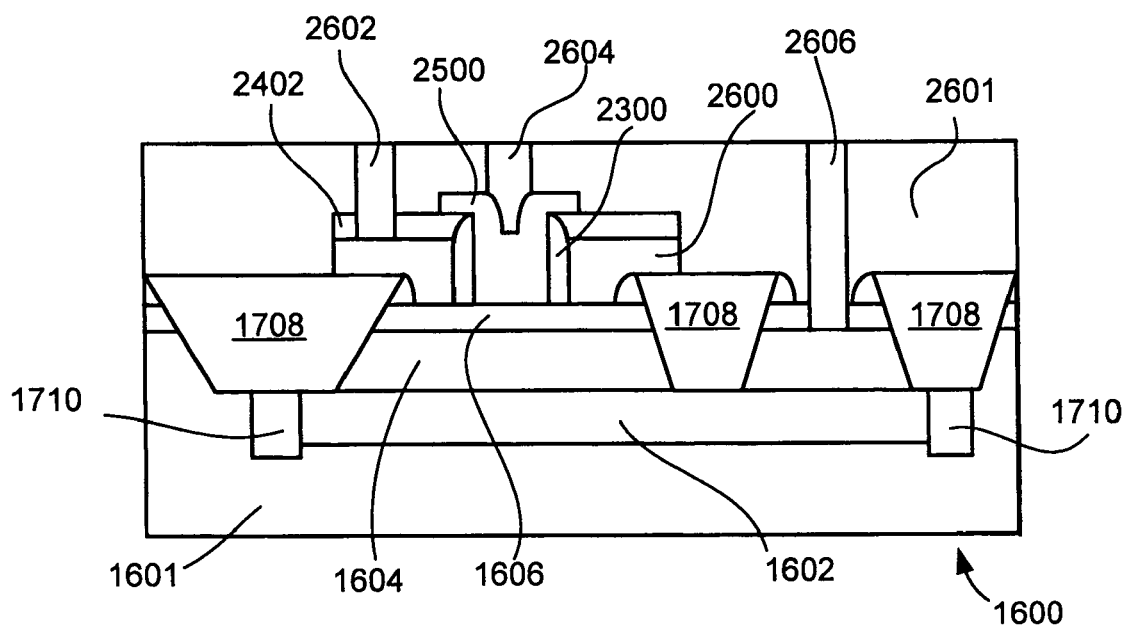
FIG. 26 is the structure of FIG. 25 after forming a base contact, an emitter contact and a collector contact.

Referring now to FIG. 26, therein is shown the structure of FIG. 25 after processing the polysilicon layer 2400 to form an extrinsic base structure 2600 and an ILD layer 2601. The extrinsic base structure 2600 is formed beside, and specifically not under, the emitter structure 2500. The extrinsic base structure 2600 contacts the epitaxial layer 1606 so the portion of the epitaxial layer 1606 that is in contact with the extrinsic base structure 2200 functions as part of the extrinsic base of the HBT 1600.

The ILD layer 2601 has been deposited and openings in the ILD layer 2601 have been formed for the various contacts. A base contact 2602 has been deposited through the ILD layer 2601 and the insulating layer 2402 into contact with the extrinsic base structure 2600. An emitter contact 2604 has been deposited through the ILD layer 2601 into contact with the emitter structure 2500. A collector contact 2606 has been deposited through the ILD layer 2601 into contact with the sub-collector region 1604.

Although no salicide layers have been provided in the embodiments shown in FIG. 22 and FIG. 26, it will be apparent to one skilled in the art that such salicide layers can be provided without departing from the spirit and scope of the present invention.

Referring now to FIG. 27, therein is shown a method 2700 of the present invention. The method 2700 of the present invention includes a block 2702 of providing a semiconductor substrate having a collector region; a block 2704 of forming an intrinsic base region of a compound semiconductive material over the collector region; a block 2706 of forming a reverse emitter window over a portion of the intrinsic base region; a block 2708 of forming an extrinsic base region over the remaining portion of the intrinsic base region; a block 2710 of etching the reverse emitter window to form an emitter window; a block 2712 of forming an emitter structure in the emitter window; a block 2714 of forming an interlevel dielectric layer over the collector region, extrinsic base region and emitter structure; and a block 2716 of forming connections through the interlayer dielectric layer to the base region, the emitter structure, and the collector region.

Thus, it has been discovered that the method and apparatus of the present invention furnishes important and heretofore unavailable solutions, capabilities, and functional advantages for manufacturing HBTs. The resulting process and configurations are straightforward, economical, uncomplicated, highly versatile and effective, use conventional technologies, and are thus readily suited for manufacturing HBTs and are fully compatible with conventional manufacturing processes and technologies.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

The invention claimed is:

1. A method of manufacturing a heterojunction bipolar transistor comprising:

providing a semiconductor substrate having a collector region;

forming an intrinsic base region of a compound semiconductive material over the collector region;
forming a reverse emitter window over a portion of the intrinsic base region;
forming a polysilicon layer over the reverse emitter window and the remaining portion of the intrinsic base region;
performing a chemical mechanical polish of the polysilicon layer to level the upper surface of the polysilicon layer with the upper surface of the reverse emitter window;
recessing the polysilicon layer below the upper surface of the reverse emitter window to form an extrinsic base structure over a remaining portion of the intrinsic base region;
growing a dielectric layer over the extrinsic base structure;
processing the reverse emitter window to form an emitter window having a multi-layer reverse insulating spacer therein;
forming an emitter structure in the emitter window;
forming an interlevel dielectric layer over the collector region, extrinsic base structure and emitter structure; and
forming connections through the interlevel dielectric layer to the collector region, the extrinsic base structure, and the emitter structure.

2. The method as claimed in claim 1 wherein forming the intrinsic base region comprises forming a layer of compound semiconductive material of silicon-germanium, silicon-germanium-carbon, or a combination thereof.

3. The method as claimed in claim 1 wherein forming the intrinsic base region comprises forming a compound semiconductive material layer by selectively depositing, selectively growing, or field depositing, or a combination thereof.

4. The method as claimed in claim 1 wherein:
forming the reverse emitter window comprises forming a first insulating layer and a second insulating layer; and
processing the reverse emitter window comprises anisotropically etching the first insulating layer and the second insulating layer to form an emitter window having a multi-layer reverse insulating spacer therein.

5. The method as claimed in claim 1 wherein forming an intrinsic base region of a compound semiconductive material over the collector region forms the intrinsic base region in the bottom and on the sides of the emitter window.

6. A method of manufacturing a heterojunction bipolar transistor comprising:
providing a semiconductor substrate having a collector region;
forming an intrinsic base region of a compound semiconductive material over the collector region;
forming a reverse emitter window over the intrinsic base region;
forming a first polysilicon layer over a portion of the intrinsic base region uncovered by the reverse emitter window;
performing a chemical mechanical polish of the polysilicon layer to level the upper surface of the polysilicon layer with the upper surface of the reverse emitter window;
recessing the polysilicon layer below the upper surface of the reverse emitter window to form an extrinsic base structure over the intrinsic base region uncovered by the reverse emitter window;
growing a dielectric layer over the first polysilicon layer;
processing the reverse emitter window to form an emitter window having a multi-layer reverse insulating spacer therein;
forming a second polysilicon layer over the dielectric layer and into the emitter window;
processing the second polysilicon layer to form an emitter structure;
processing the first polysilicon layer to form an extrinsic base structure over a portion of the intrinsic base region beside and spaced from the emitter structure;
forming an interlevel dielectric layer over the collector region, the extrinsic base structure, and the emitter structure; and
forming connections through the interlayer dielectric layer to the collector region, the extrinsic base structure, and the emitter structure.

7. The method as claimed in claim 6 wherein forming the intrinsic base region comprises forming a layer of compound semiconductive material of silicon-germanium, silicon-germanium-carbon, or a combination thereof.

8. The method as claimed in claim 6 wherein forming the intrinsic base region comprises forming a compound semiconductive material layer by selectively depositing, selectively growing, or field depositing, or a combination thereof.

9. The method as claimed in claim 6 wherein:
forming the reverse emitter window comprises forming a first insulating layer and a second insulating layer; and
processing the reverse emitter window comprises anisotropically etching the first insulating layer and the second insulating layer to form an emitter window having a multi-layer reverse insulating spacer therein.

10. The method as claimed in claim 6 wherein forming an intrinsic base region of a compound semiconductive material over the collector region forms the intrinsic base region in the bottom and on the sides of the emitter window.

* * * * *